(12) United States Patent
Schaule et al.

(10) Patent No.: US 8,232,815 B2
(45) Date of Patent: Jul. 31, 2012

(54) PLUNGER FOR HOLDING AND MOVING ELECTRONIC COMPONENTS IN PARTICULAR ICS

(75) Inventors: Max Schaule, Mindelheim (DE); Stefan Thiel, Rosenheim (DE); Franz Pichl, Übersee (DE); Günther Jeserer, Tuntenhausen (DE); Andreas Wiesböck, Stephanskirchen (DE); Alexander Bauer, Rosenheim (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 255 days.

(21) Appl. No.: 12/599,371

(22) PCT Filed: Oct. 2, 2008

(86) PCT No.: PCT/EP2008/008389
§ 371 (c)(1),
(2), (4) Date: Nov. 9, 2009

(87) PCT Pub. No.: WO2009/046945
PCT Pub. Date: Apr. 16, 2009

(65) Prior Publication Data
US 2010/0303589 A1 Dec. 2, 2010

(30) Foreign Application Priority Data

Oct. 5, 2007 (DE) .................. 10 2007 047 740

(51) Int. Cl.
*G01R 31/00* (2006.01)
*G01R 31/26* (2006.01)

(52) U.S. Cl. .......... 324/750.03; 324/762.01; 324/762.02

(58) Field of Classification Search .................... None
See application file for complete search history.

(56) References Cited

U.S. PATENT DOCUMENTS

| | | | |
|---|---|---|---|
| 5,147,821 A | 9/1992 | McShane et al. | |
| 5,847,366 A * | 12/1998 | Grunfeld | 219/497 |
| 5,977,785 A | 11/1999 | Burward-Hoy | |
| 6,019,166 A * | 2/2000 | Viswanath et al. | 165/80.4 |
| 6,064,218 A | 5/2000 | Godfrey et al. | |
| 6,069,483 A * | 5/2000 | Maxwell et al. | 324/750.09 |
| 6,119,460 A | 9/2000 | Huang | |
| 6,549,026 B1 | 4/2003 | DiBattista et al. | |
| 6,891,385 B2 | 5/2005 | Miller | |
| 6,978,541 B1 | 12/2005 | Feltner et al. | |
| 7,480,985 B2 | 1/2009 | Yan | |
| 2005/0151551 A1 | 7/2005 | Okuda et al. | |

(Continued)

FOREIGN PATENT DOCUMENTS

DE 10297660 A 4/2005

(Continued)

OTHER PUBLICATIONS

International Search Report for PCT/EP2008/008389, mailed Mar. 26, 2009.

(Continued)

*Primary Examiner* — Vinh Nguyen
(74) *Attorney, Agent, or Firm* — Nixon & Vanderhye P.C.

(57) ABSTRACT

A plunger for holding and moving electrical components in particular IC's to and from a contacting device connected to a test bed, comprises a head piece with a fluid distribution chamber through which temperature-controlled fluid flows. A suction head is arranged such that the temperature-controlled fluid flows around the suction head and is diverted along the suction head to the component.

9 Claims, 5 Drawing Sheets

U.S. PATENT DOCUMENTS

Figure 1:
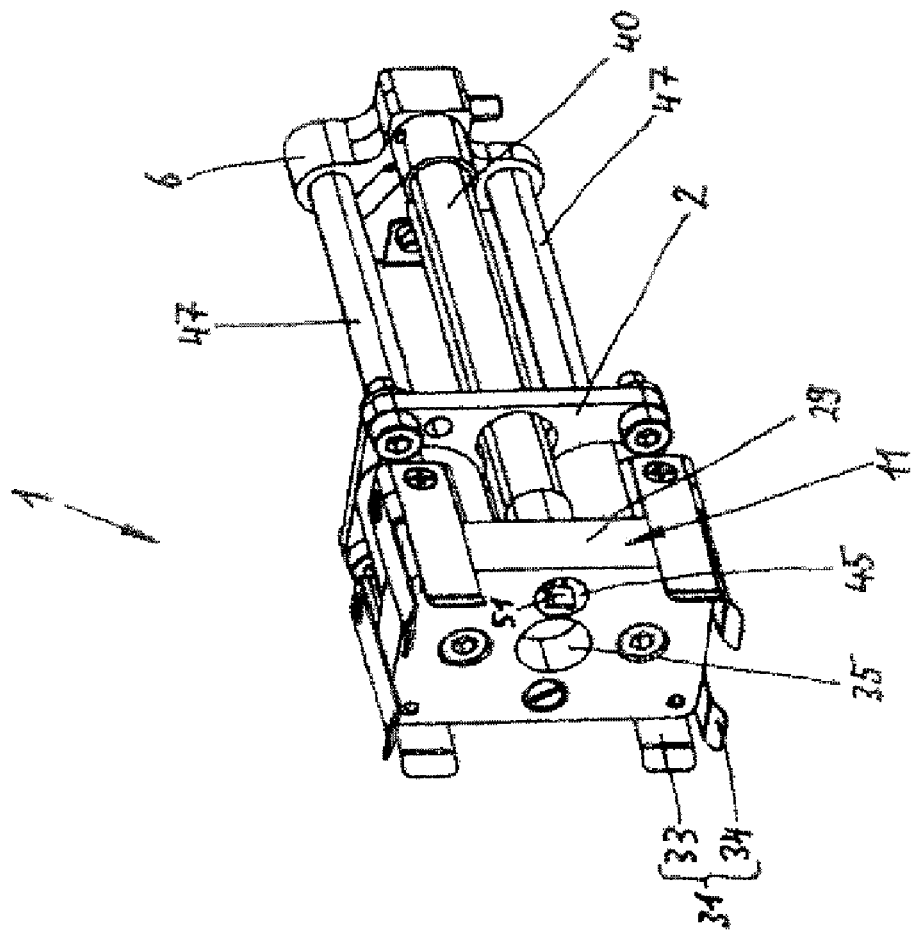
Figure 1:
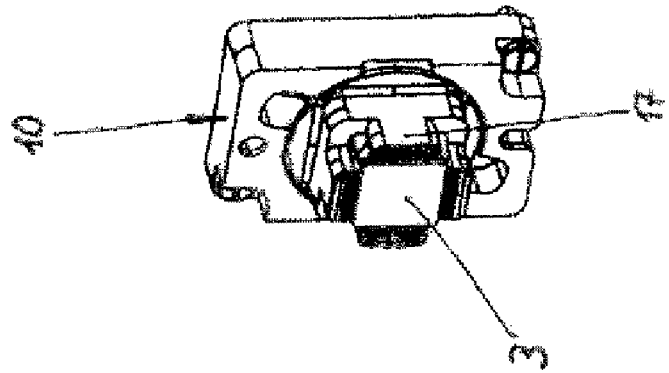

| | | | |
|---|---|---|---|
| 2006/0261833 | A1 | 11/2006 | Boyle et al. |
| 2007/0200555 | A1 | 8/2007 | Mizushima et al. |

FOREIGN PATENT DOCUMENTS

| | | | |
|---|---|---|---|
| DE | 112006000019 A | 7/2008 | |
| JP | 57031147 A | 2/1982 | |
| JP | 3137579 A | 6/1991 | |
| JP | 11064437 A | 3/1993 | |
| JP | 6297371 | 10/1994 | |
| JP | 7202095 | 8/1995 | |
| JP | 8166423 A | 6/1996 | |
| JP | 2001514756 A | 9/2001 | |
| JP | 2000329821 | 11/2003 | |
| JP | 2006125864 | 5/2006 | |
| JP | 2006125864 A | 5/2006 | |
| JP | 2007005685 | 1/2007 | |
| JP | 2007094034 | 4/2007 | |
| WO | WO 97/15837 | 5/1997 | |
| WO | 9840752 A | 9/1998 | |
| WO | 2003075023 A1 | 9/2003 | |
| WO | 2007094034 A1 | 8/2007 | |

OTHER PUBLICATIONS

International Search Report for PCT/EP2008/008390, mailed Mar. 26, 2009.

* cited by examiner

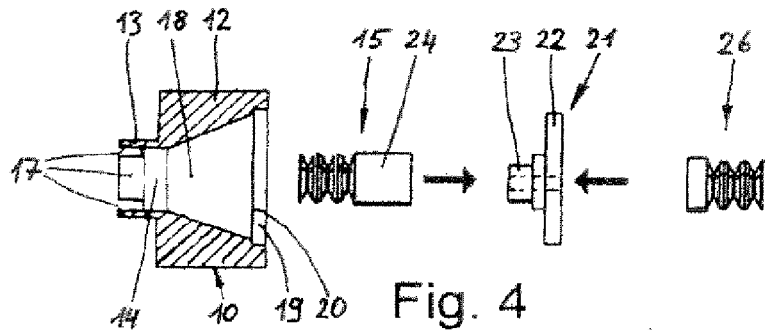
Fig. 4
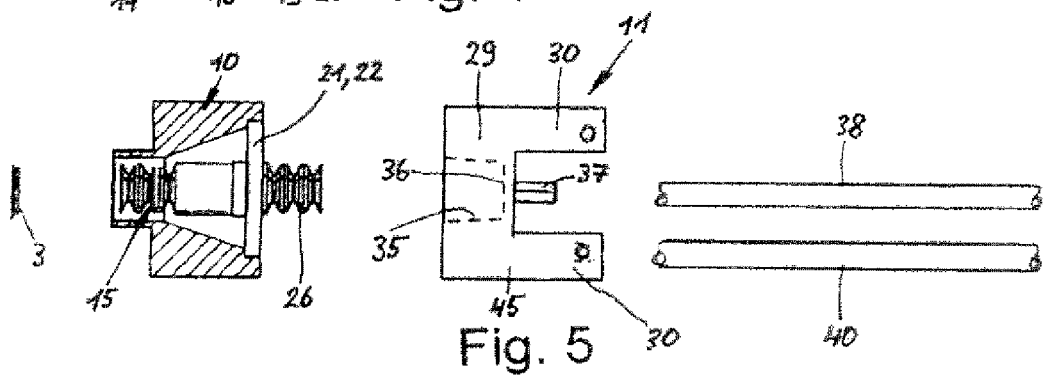
Fig. 5
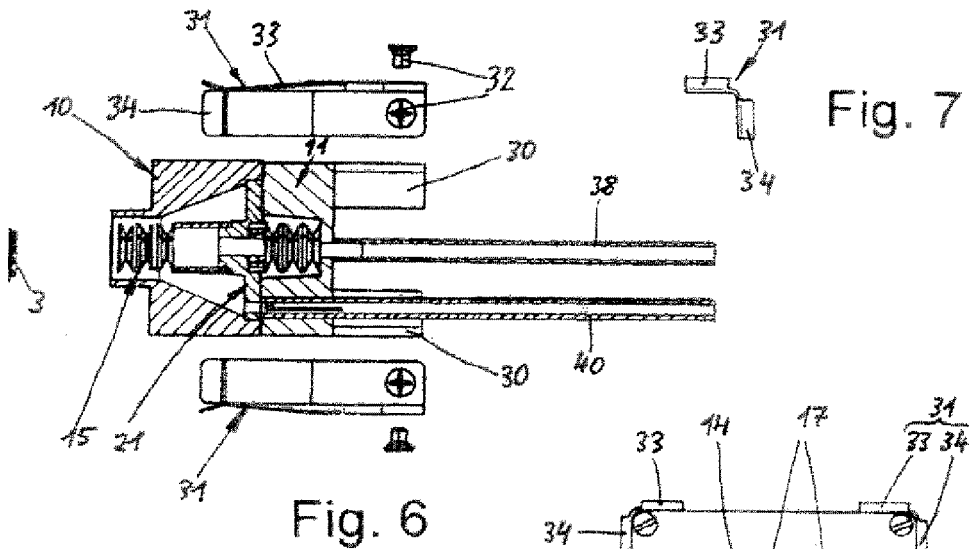
Fig. 6
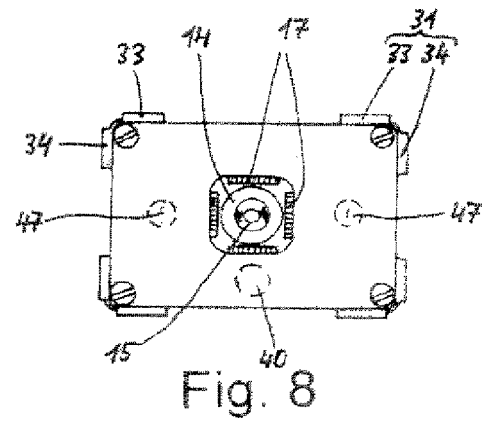
Fig. 7
Fig. 8

PLUNGER FOR HOLDING AND MOVING ELECTRONIC COMPONENTS IN PARTICULAR ICS

This application is the U.S. national phase of International Application No. PCT1EP2008/008389 filed 2 Oct. 2008, which designated the U.S. and claims priority to German Application No. DE 10 2007 047 740.8 filed 5 Oct. 2007, the entire contents of each of which are hereby incorporated by reference.

The invention relates to a plunger for holding and moving electronic components, in particular for moving ICs to and from a contacting device, which is connected to a test device, according to the preamble of claim 1.

Electronic components such as ICs (semiconductor components with integrated circuits) are usually tested for their functionality before they are mounted on printed circuit boards, for example, or used otherwise. The components to be tested are contacted by an automatic handling machine, usually called a "handler", with contacting devices which in particular are in the form of contact bases, and are in electrical contact with a test head of a test device. After the end of the test process, the components are removed from the contacting devices by means of the handler, and sorted depending on the test result.

To hold and contact the components, handlers usually have plungers, i.e. longitudinally movable holding units, which can hold the components by means of a vacuum, in particular by applying a suction force. After the components have been placed, the plungers are brought within the handler into a position in which they can be moved forward on a straight path to contacting devices, until the components come into contact with the contacting devices. After the test processes are carried out, the components are removed from the test head by means of the plunger, and positioned so that they can be removed from the handler via a discharge station and sorted depending on the test result.

To be able to carry out the tests under predetermined temperature conditions, tempering the components to predetermined temperatures before the test process is also known. These temperatures can be, for example, in a range from −60° C. to +200° C.

The components are usually tempered in a convective and/or conductive manner in a heat-insulated tempering chamber, which can be arranged inside or outside the handler. In this case, multiple components are brought to the desired temperature simultaneously inside the tempering chamber, before they are put onto the plungers and moved forward by them to the contacting devices. A disadvantage here is that in the time between the heating and the contacting of the components, heat losses occur, with the result that at the time of the test, the components are no longer at the precise setpoint temperature. Also, because of the contact with the contacting devices during the test, heat flows to or from the component can occur. The individual components which have been tempered together in the tempering chamber can also have different temperatures.

From U.S. Pat. No. 5,977,785 A, a plunger according to the preamble of claim 1 is known. The plunger there has a head piece with a plurality of suction heads and a contact plate which is arranged separately from the suction heads, and which can be heated or cooled by means of a hot or cold fluid. The sucked-in components fit closely to the contact plate and can be tempered thereby. The tempered fluid is fed to the contact plate and taken away from it in closed circuits. However, a disadvantage here is that the head piece has a complex structure, and a contact plate of relatively large format, which has internal fluid channels and corresponding connections for the fluid connecting lines, is required. For very small components, such a head piece is unsuitable.

The invention is based on the object of creating a plunger of the above-mentioned kind, with which tests of electronic components can be carried out under predetermined temperature conditions as precisely as possible. The plunger should also be simply constructed and have a small overall size in the head region, so that it is suitable even for small components.

According to the invention, this object is achieved by a plunger with the features of claim 1. Advantageous embodiments of the invention are described in the further claims.

According to the invention, the head piece has a fluid distribution chamber through which tempered fluid flows, and in which the suction head is arranged, so that the tempered fluid flows round the suction head and is passed on to the component along the suction head.

Because the tempering device is arranged directly on the plunger, the component which is held on the plunger can be tempered while it is being delivered to the assigned contacting device, and even during the test process, so that heat losses during the delivery movement and during the test process do not occur, or at least can be minimised. Permanent tempering of the components is thus possible in a very precise manner, during the whole process. The particularly advantageous effect of the fluid distribution chamber is that the tempered fluid does not merely strike the component here and there, but over a wide area, and heats it evenly. The head piece can also be simply constructed and have a small overall size, so that the plunger can not only be used for large components, but also for very small ones.

Clean air is expediently used as the fluid, and is tempered in a corresponding manner. However, it is of course also possible to use other gases, which can be advantageous in particular in the case of low temperature tests.

According to an advantageous embodiment, the fluid feed line comprises a heating pipe which extends between the rear end portion and the front plunger portion, and in which a heating device to heat the fluid is provided. The heating device can advantageously consist of an electrical resistance heater in the form of a heating spiral, which extends at least over a greater part of the length of the intermediate portion, in this way, the fluid which flows through the heating pipe can be tempered in a very effective way which can be precisely regulated. However, any other heating elements which can be implemented from the point of view of size are conceivable.

According to an advantageous embodiment, the front portion of the plunger includes a base body which is fixed on the intermediate portion, and the head piece which is fixed on the base body and has an axial through opening, which includes the fluid distribution chamber, and through which the tempered fluid is conducted to the component. By dividing the front portion of the plunger into a base body and a head piece, relatively simple production and assembly of the front plunger portion is possible.

According to an advantageous embodiment, the head piece is fixed on the base body so that it can be shifted laterally, and is pushed into a centred position relative to the base body by means of spring elements. In this way, it is possible in a particularly simple manner to centre the component relative to the contacting device as it is guided to the contacting device, by means of a centring device which is arranged directly in front of the contacting device, without the whole plunger having to be deflected sideways. Instead, only the head piece is moved laterally relative to the base body by the centring device if this is necessary.

According to an advantageous embodiment, the fluid distribution chamber is arranged in the head piece. However, alternatively it is also conceivable to arrange the fluid distribution chamber in the base body.

According to an advantageous embodiment, arranged in a front end region of the axial through opening is a heat conducting body which consists of an effective heat conducting material and which has a large surface on which the tempered fluid flows, and is arranged such that the component, which is sucked tightly by the suction head, is in contact with the heat conducting body over a wide area. In this way, the heat transfer from the tempered fluid to the component can be improved.

Advantageously, the heat conducting body is held resiliently within the through opening, so that the position of the heat conducting body can be adjusted for different positions of the component. This ensures that a close contact over a wide area between heat conducting body and component occurs even if the component impacts the corresponding contact surface of the heat conducting body somewhat diagonally when it is drawn up by suction by the suction head. Also, in this case the connecting legs of the component rest evenly on supporting strips (lead backers), which project forward from the head piece and support the component legs. The component is thus also less stressed mechanically by the resiliently arranged heat conducting body.

According to an advantageous embodiment, arranged in the front end region of the fluid feed line is a temperature sensor, which is part of a controller to regulate the temperature generated by the tempering device. Because the temperature sensor is very close to the component, the prevailing temperature in the region of the component can be recorded very precisely. The temperature can therefore be regulated very quickly and precisely. If the tempering device comprises a heating device, which is arranged on or in the plunger, for heating fluid which is conducted to the component in the fluid feed line, the temperature sensor is thus expediently located between the component and the heating device, i.e. seen in the direction of flow of the fluid, downstream of the heating device and just before the component to be tested. Thus by using the temperature sensor, a closed loop to adjust the actual temperature in the region of the component to the setpoint temperature can be achieved.

Figure 2:
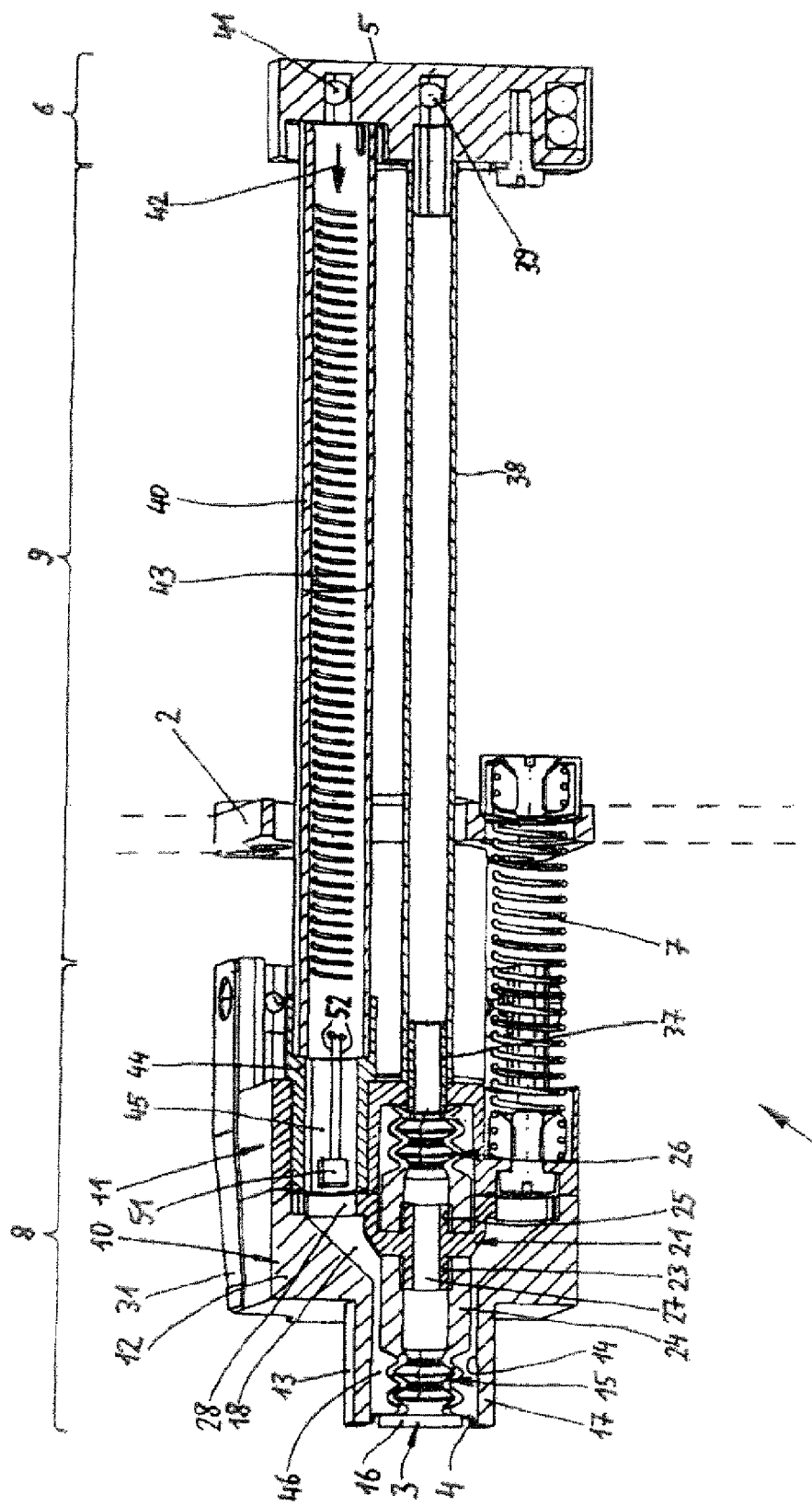
Figure 3:
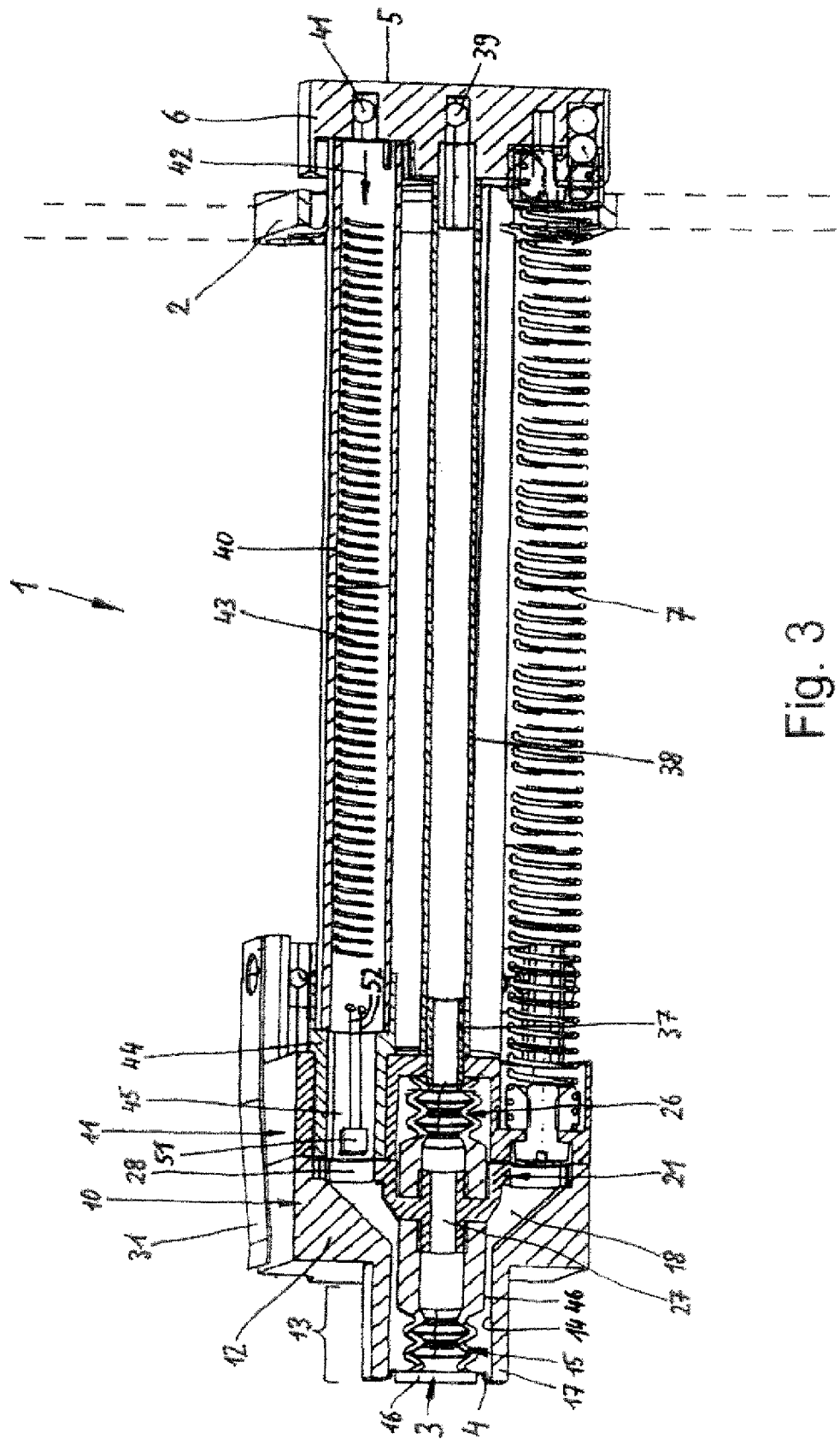
Figure 9:
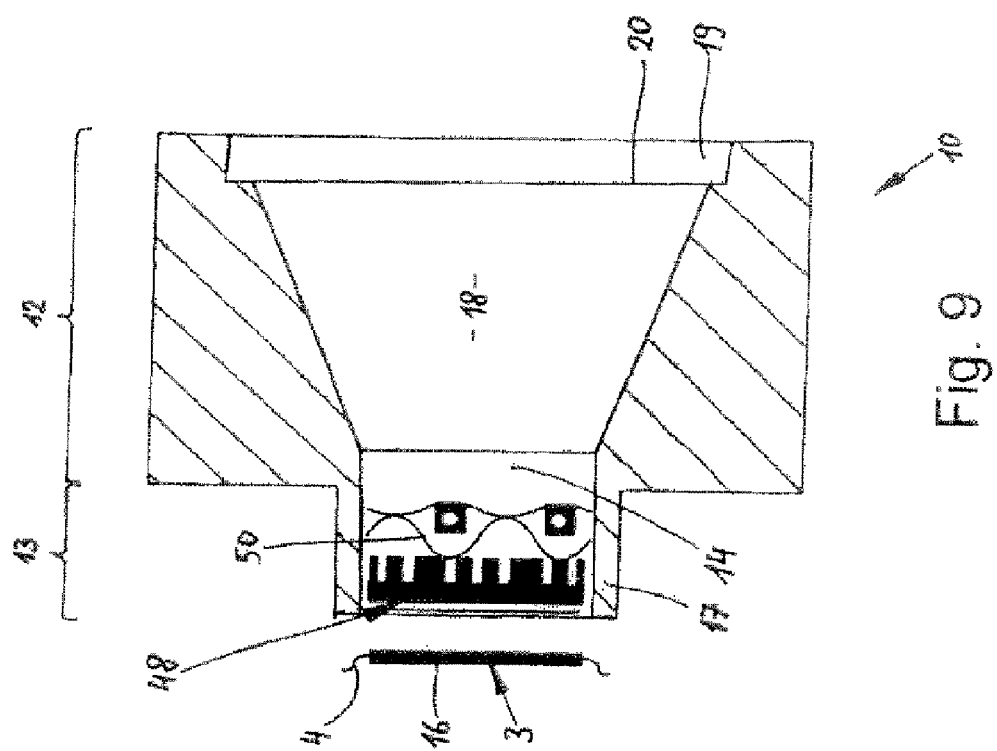
Figure 10:
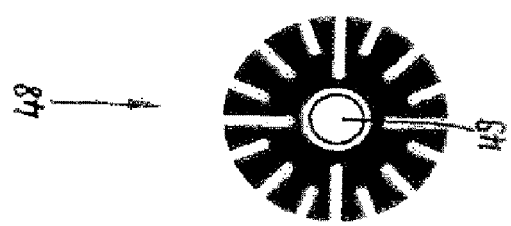
Figure 11:
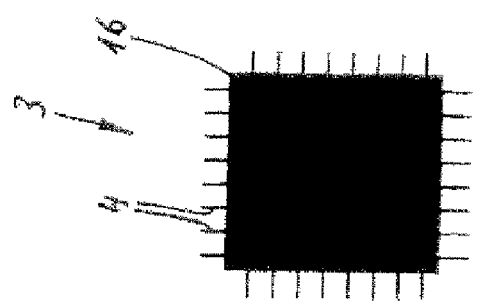

The invention is explained in more detail below by way of example with reference to the drawings, in which FIG. 1 shows a perspective representation of a plunger according to the invention, the head piece of its front portion being shown separately from the base body, FIG. 2 shows a central longitudinal section through the plunger of FIG. 1, the plunger being in the withdrawn starting position, FIG. 3 shows a longitudinal section according to FIG. 2, the plunger being in the pushed-forward contacting position, FIG. 4 shows an exploded representation of the head piece in longitudinal section, and of the suction head with adjacent parts, FIG. 5 shows an exploded representation with further individual parts of the plunger, the parts from FIG. 4 being shown in the assembled state, FIG. 6 shows a longitudinal section through the parts from FIG. 5 in the assembled state, additional spring elements to centre the head piece being shown, FIG. 7 shows a plan view of the spring elements from FIG. 6, FIG. 8 shows a front view of the plunger, FIG. 9 shows a longitudinal section of a head piece of the plunger, in which a heat conducting body is inserted, FIG. 10 shows a plan view of the heat conducting body from FIG. 9, and FIG. 11 shows a plan view of a component.

In FIGS. 1 to 3, a plunger 1, which is guided so that it can be moved lengthways on a plunger guiding device 2, can be seen. The plunger guiding device 2 can, for example, be fixed (in a way not shown) to a rotating carriage or swiveling device, with which the plunger 1, together with an electronic component 3 which is to be tested and is placed on the plunger 1, can be brought into a position in which the plunger 1 can be moved forward in a straight line (to the left in FIGS. 2 and 3) into a contact position, in which the connecting legs 4 (pins) of the component 3 (see FIG. 11) are placed on corresponding connecting contacts (not shown) of a contacting device (contact base). The plunger 1 is thus a holding device to hold a component 3, which can be moved backward and forward like a piston between a withdrawn position shown in FIG. 2 and a forward position shown in FIG. 3. The forwards movement is effected by means of a feed device (not shown) which presses on a rear end face 5 of a rear end portion 6 of the plunger 1. The plunger 1 is moved back into its initial position by a restoring spring 7 (to be described in more detail below), the rear end of which is fixed to the plunger guiding device 2.

The plunger 1 consists of a front portion 8, an intermediate portion 9 and the rear end portion 6.

The front portion 8 has, at its front end, a head piece 10, and axially adjoining it, a base body 11. The head piece 10 consists of a cuboidal head piece portion 12, from which a front head piece end portion 13, of reduced diameter, extends in an axial direction. Internally, the head piece 10 has a central, axial through opening 14. Into this through opening 14, from the rear, i.e. from the right in FIG. 4, a suction head 15 of a pneumatic holding device, with which the component 3 can be sucked tightly, can be inserted.

The through opening 14, in the region of the front head piece end portion 13, has a diameter which is greater than that of the body 16 of the component 3, so that the body 16 can be placed in the region of the through opening 14 at a radial distance to leg supporting webs 17, which form the front end of the head piece end portion 13. The connecting legs 4 of the component 3 rest on the leg supporting webs 17, and thus ensure a defined position of the component 3 relative to the head piece 10 of the plunger 1. The arrangement and configuration of the leg supporting webs 17 depend on the type of components 3 to be tested. Provided in this embodiment are four flat leg supporting webs 17, which as can be seen in particular in FIG. 8 are arranged at right angles to each other and frame the through opening 14 from all four sides.

In the region of the cuboidal head piece portion 12, the diameter of the through opening 14 widens to the rear, and forms a conical fluid distribution chamber 18.

In the rear end region of the head piece 10, there is a recess 19, which with the peripheral wall of the fluid distribution chamber 18 forms an encircling shoulder 20. The fluid distribution chamber 18 is dimensioned such that it can receive a suction hose connector 21, a flange piece 22 of the suction hose connector 21 being inside the recess 19, resting against the shoulder 20.

The suction hose connector 21 has at its front end a central, axially projecting pipe socket 23, onto which a hose portion 24 of the suction head 15 can be attached. A rear pipe socket 25, shown in FIGS. 2 and 3, of the suction hose connector 21 is used for attaching a rear corrugated hose 26. The pipe sockets 23, 25 surround an axial through suction hole 27, which creates a fluid-tight join between the suction head 15 and the rear corrugated hose 26.

Additionally, provided in the flange piece 22 of the suction hose connector 21 is an axial hole 28 (FIG. 2, 3), through which tempered fluid can be introduced into the fluid distribution chamber 18 as explained in more detail below.

As can be seen, in particular, in FIGS. 1 and 5, the base body 11 consists of a cuboidal base portion 29 and four spring anchor elements 30. The spring anchor elements 30 are each formed in the corner regions of the base portion 29, have an L-shaped cross-section, and extend from the base portion 29 rearwards beyond it. Spring elements 31, which are shown in FIGS. 1 and 6-8, can be fixed to the spring anchor elements 30 by bolts 32.

Each of the four spring elements 31 has two spring tongues 33, 34, which are arranged at right angles to each other and are joined to each other, and which project forward in the axial direction over the base body 11, as can be seen, in particular, in FIG. 1. If the head piece 10 is attached to the base body 11, the spring tongues 33, 34 rest laterally against the cuboidal head piece portion 12, and thus centre the head piece 10 in the lateral direction relative to the base body 11. Because of the resilient effect of the spring elements 31, the head piece 10 can easily be moved laterally relative to the base body 11, when the head piece 10 is guided past a centring device (not shown), which can be in the immediate vicinity of the contact base. In the case of such a centring process, this prevents the whole plunger 1 having to be moved laterally, and thus possibly deformed.

The base body 11 has a central axial hole 35 (FIGS. 1, 5) of relatively large diameter, the purpose of which is to receive the corrugated hose 26. The trailing end of the corrugated hose 26 fits closely to a wall 36, which delimits the axial hole 35 to the rear. Via a pipe socket 37, which penetrates the wall 36, and the purpose of which is to attach a suction hose 38, the inside of the corrugated hose 26 is connected to the suction hose 38.

As can be seen in FIGS. 1 to 3, the suction hose 38 extends from the base body 11 to the rear end portion 6, and is connected via a suction channel 38, which is provided in the rear end portion 6, and a flexible suction line (not shown) to a vacuum generation device (not shown), which can be arranged stationarily, for example within a handler, i.e. an automatic handling machine for electronic components.

Thus, on the basis of the described arrangement, the inside of the suction head 15 is in fluid connection with the vacuum generation device, so that by generation of an appropriate vacuum, the component 3 can be sucked tightly to the front of the suction head 10, and held tightly to the plunger 1.

The plunger 1 has its own tempering device, to bring the component 3, which is held on the suction head 15, to a specified temperature by means of tempered fluid. The tempering device is described on the basis of an embodiment in which the fluid and thus the component 3 are heated. However, using a tempering device on the plunger 1 to cool the component 3 is also conceivable.

The tempering device has a fluid feed line 40, which is connected via a fluid channel 41, which is in the rear end portion 6, and a flexible fluid line (not shown), to a fluid supply device. By means of this fluid supply device, fluid, e.g. clean air, which can have the ambient temperature or be already pre-tempered, is introduced at a specified pressure into the fluid feed line 40, as illustrated by the arrow 42. The fluid feed line 40 is a pipe which extends from the rear end portion 6 of the plunger 1 to the front portion 8, and is arranged parallel to the suction hose 38. Within the fluid feed line 40 is a heating device 43, which in the shown embodiment is in the form of a heating spiral, which extends over most of the length of the fluid feed line 40.

The fluid feed line 40 is fixed at its front end to an axially aligned connection socket 44, which penetrates the cuboidal base portion 29 of the base body 11 in the axial direction and is fixed therein. The leading end of the connection socket 44 fits closely on the suction hose connector 21, the axial hole 28 of which aligns with the channel 45 of the connection socket 44. Also, since the axial hole 28 in the suction hose connector 21 opens into the fluid distribution chamber 18 of the head piece 10, the fluid which is brought via the fluid feed line 40, after it has been heated by means of the heating device 43 to the predetermined setpoint temperature, can be guided evenly in the fluid distribution chamber 18 around the whole suction head 15, and can be guided to the component 3 in the annular space 46 between the suction head 15 and the head piece end portion 13. The component 3 thus receives a flow of tempered fluid in the region around the suction head 15, and is tempered accordingly.

In FIGS. 1 to 3, a temperature sensor 51, which is arranged in the front end region of the fluid feed line 40 just before the fluid distribution chamber 18, can also be seen. The temperature sensor 51 is part of a controller, using which the power of the heating device 43 can be regulated as a function of the actual temperature which the temperature sensor 51 measures. FIGS. 2 and 3 show electrical lines 52, by which the temperature sensor 51 is connected to the controller. These lines 52 are guided outside the heating pipe in a region between the temperature sensor 51 and the heating device 43, to reduce the stress and effect on them by the temperature which the heating device 43 generates.

Within the invention, numerous alternative tempering devices are conceivable. For example, it is possible, instead of tempering the fluid for the first time in the region of the plunger 1, to feed a fluid which has already been appropriately tempered via the plunger 1 to the component 3. However, the tempering device which is presented on the basis of the figures has the advantage that the fluid is tempered in the close vicinity of the component 3, so that the power of the tempering device, and thus the fluid temperature, can be subsequently regulated in the shortest time, if it is established by means of sensors (not shown) that the actual temperature differs from the setpoint temperature.

The plunger 1 is guided on the plunger guiding device 2 by means of two parallel guide rods 47, which can be seen only in FIG. 1. The guide rods 47 are fixed at their leading ends to the base body 11, and at their trailing ends to the rear end portion 6 of the plunger 1. The guide rods 47 are guided so that they can move lengthways in appropriate guide bushings, which are provided in the plunger guiding device 2.

As explained above, the plunger 1 is moved back from the pushed-forward contact position shown in FIG. 3 to the withdrawn starting position shown in FIG. 2 by means of the restoring spring 7. The restoring spring 7 is fixed at its trailing end to the plunger guiding device 2 and at its leading end to the base body 11. The restoring spring 7 is a tension spring, which is stretched when the plunger 1 is transferred from the starting position into the pushed-forward contact position shown in FIG. 3.

To improve the heat transfer from the tempered fluid to the component 3, a heat conducting body 48, shown in FIGS. 9 and 10, can be provided. The heat conducting body 48 consists of a disc-shaped body with multiple projections or fins, which are directed backward, i.e. against the direction of fluid flow. The heat conducting body 48 also consists of an effective heat conducting material. On its front end face, which comes into contact with the body 16 of the component 3, the heat conducting body 48 is of flat form, so that the largest possible contact surface between heat conducting body 48 and component 3 is created.

The outer diameter of the heat conducting body 48 is only slightly smaller than the diameter of the through opening 14 of the head piece end portion 13, and substantially fills it. A central hole in the heat conducting body 48 enables the leading end of the suction head 15 to pass through, so that the heat conducting body 48 can be arranged around the suction head 15, without affecting its function. When the component 3 is sucked in by the suction head 15, the component 3 is pulled against the heat conducting body 48, so that it rests against the latter over its whole surface.

To ensure that the component 3 rests flatly against the heat conducting body 48 even if the connecting legs 4 of the component 3 are not optimally aligned and they rest unevenly on the leg supporting webs 17, the heat conducting body 48, as shown schematically in FIG. 9, is supported resiliently in the through opening 14 by a spring device 50. This spring device 50 is in such a form that the heat conducting body 48 can be brought into diagonal positions within the through opening 14, to adapt itself to a possible diagonal position of the component body 16, and thus to maintain close contact with the component body 16.

The invention claimed is:

1. Plunger for holding and moving electronic components, in particular ICs, to and from a contacting device, which is connected to a test device, comprising
    a headpiece,
    a suction head, which is arranged in the head piece, for sucking in a component,
    a tempering device to temper the component which is held on the suction head by means of a fluid,
    wherein the head piece has a fluid distribution chamber through which tempered fluid flows, and in which the suction head is arranged, so that the tempered fluid flows round the suction head and is passed directly on to the component along the suction head.

2. Plunger according to claim 1, wherein the plunger has a front portion, a rear end portion and an intermediate portion, the tempering device having at least one fluid feed line which opens into the front portion, and comprises a heating pipe which extends between the rear end portion and the front portion of the plunger, and in which a heating device to heat the fluid is provided.

3. Plunger according to claim 2, wherein the heating device comprises an electrical resistance heater in the form of a heating spiral, which extends at least over the greater part of the length of the intermediate portion.

4. Plunger according to claim 2, wherein the front portion of the plunger comprises a base body which is fixed on the intermediate portion, and the head piece, which is fixed on the base body and has an axial through opening, which includes the fluid distribution chamber, and through which the tempered fluid is conducted to the component.

5. Plunger according to claim 4, wherein the head piece is fixed on the base body so that it can be shifted laterally, and is pushed into a centred position relative to the base body by means of spring elements.

6. Plunger according to claim 5, wherein the spring elements comprise a plurality of spring tongues, which are fixed on the base body and overlap the head piece from opposite sides.

7. Plunger according to claim 4, wherein arranged in a front end region of the axial through opening is a heat conducting body comprising an effective heat conducting material, said heat conducting body having a large surface on which the tempered fluid flows, and being arranged such that the component (3), which is sucked tightly by the suction head, is in contact with the heat conducting body over a wide area.

8. Plunger according to claim 7, wherein the heat conducting body is held resiliently within the through opening, so that the position of the heat conducting body can be adjusted for different positions of the component.

9. Plunger according to claim 2, wherein arranged in the front end region of the fluid feed line is a temperature sensor, which is part of a controller to regulate the temperature which the tempering device generates.

* * * * *